(12) United States Patent
Tanaka et al.

(10) Patent No.: US 11,056,152 B2
(45) Date of Patent: Jul. 6, 2021

(54) SEMICONDUCTOR MEMORY DEVICE

(71) Applicant: Kioxia Corporation, Minato-ku (JP)

(72) Inventors: Takuto Tanaka, Yokkaichi (JP); Takeo Mori, Yokkaichi (JP); Takashi Terada, Yokkaichi (JP); Takamichi Tsuchiya, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/798,524

(22) Filed: Feb. 24, 2020

(65) Prior Publication Data
US 2021/0043234 A1 Feb. 11, 2021

(30) Foreign Application Priority Data
Aug. 9, 2019 (JP) .............................. JP2019-147772

(51) Int. Cl.
*G11C 5/02* (2006.01)
*H01L 27/11582* (2017.01)
*H01L 27/11556* (2017.01)
*G11C 5/06* (2006.01)

(52) U.S. Cl.
CPC ................. *G11C 5/025* (2013.01); *G11C 5/06* (2013.01); *H01L 27/11556* (2013.01); *H01L 27/11582* (2013.01)

(58) Field of Classification Search
CPC ....... G11C 5/025; G11C 5/06; G11C 16/0483; H01L 27/11582; H01L 27/11556
USPC .................................................. 365/185.17
See application file for complete search history.

(56) References Cited

U.S. PATENT DOCUMENTS

| | | | |
|---|---|---|---|
| 8,530,955 | B2 | 9/2013 | Iino et al. |
| 9,978,769 | B2 | 5/2018 | Shimura |
| 10,403,636 | B2 | 9/2019 | Inokuma et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2011/0284946 | A1 | 11/2011 | Kiyotoshi |
| 2017/0309634 | A1 | 10/2017 | Noguchi et al. |
| 2018/0269225 | A1 | 9/2018 | Huang et al. |
| 2019/0081062 | A1 | 3/2019 | Wada et al. |
| 2019/0172839 | A1 | 6/2019 | Tokuda |
| 2019/0287925 | A1 | 9/2019 | Ooshima |
| 2020/0127009 | A1* | 4/2020 | Song ................. H01L 27/11582 |

(Continued)

FOREIGN PATENT DOCUMENTS

| | | |
|---|---|---|
| JP | 2012-070004 A | 4/2012 |
| JP | 2018-046167 A | 3/2018 |
| JP | 2020-150147 A | 9/2020 |

*Primary Examiner* — Fernando Hidalgo
(74) *Attorney, Agent, or Firm* — Oblon, McClelland, Maier & Neustadt, L.L.P.

(57) ABSTRACT

According to one embodiment, a semiconductor memory device includes: a memory cell array including: a plurality of memory cells stacked above a substrate, and a plurality of word lines respectively coupled to gates of the plurality of memory cells and extending in a first direction; and a first film including a first area above the memory cell array and a second area different from the first area, and having a compressive stress higher than silicon oxide. In the first area, a plurality of first trenches extending in the first direction are aligned in a second direction that intersects the first direction. In the second area, a second trench in a mesh form is provided.

20 Claims, 9 Drawing Sheets

(56) References Cited

U.S. PATENT DOCUMENTS

2020/0286913 A1* 9/2020 Noguchi ............... H01L 23/291
2020/0295034 A1 9/2020 Suzuki et al.
2020/0295043 A1* 9/2020 Nishida ............. H01L 27/11582

* cited by examiner

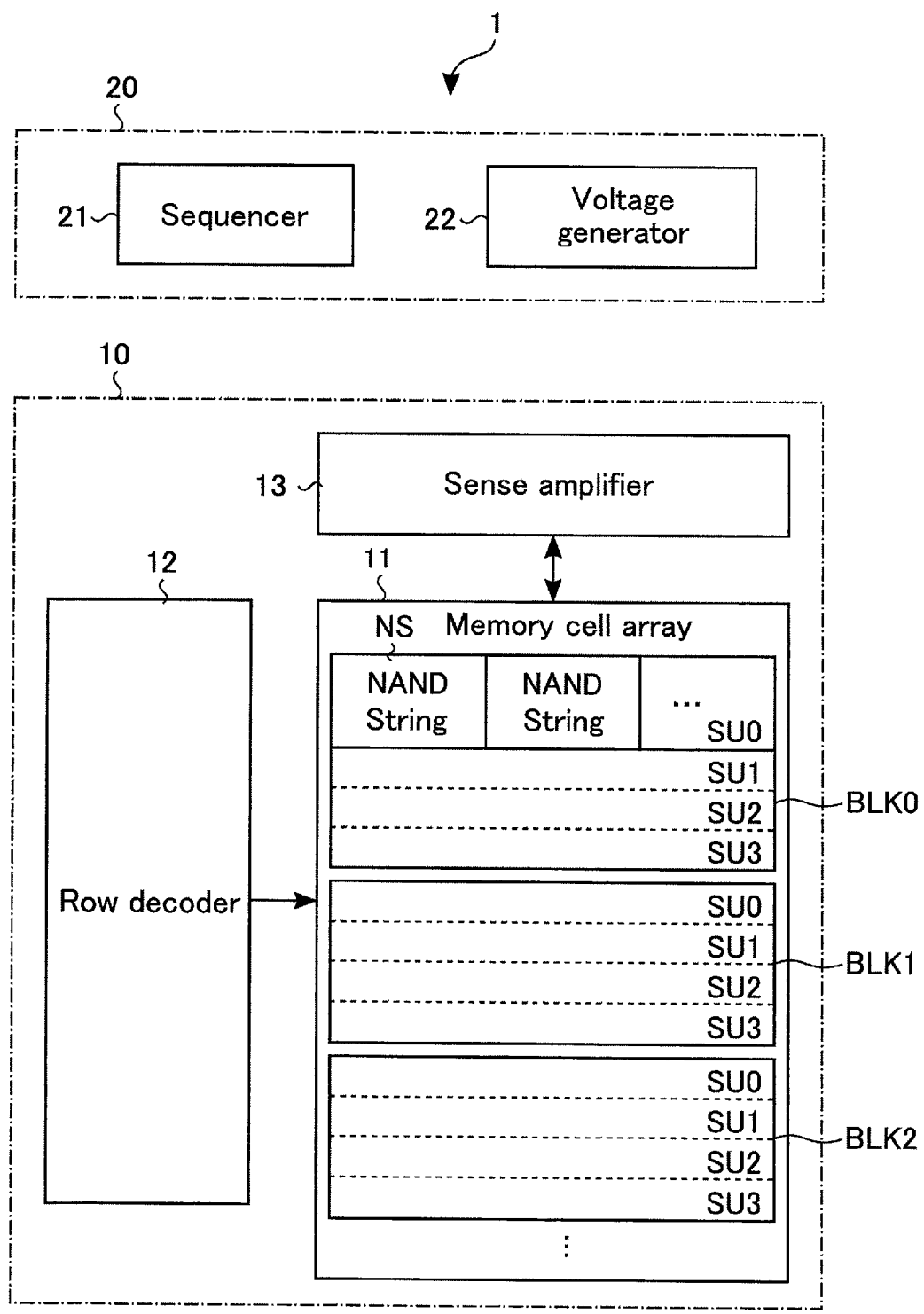
F I G. 1

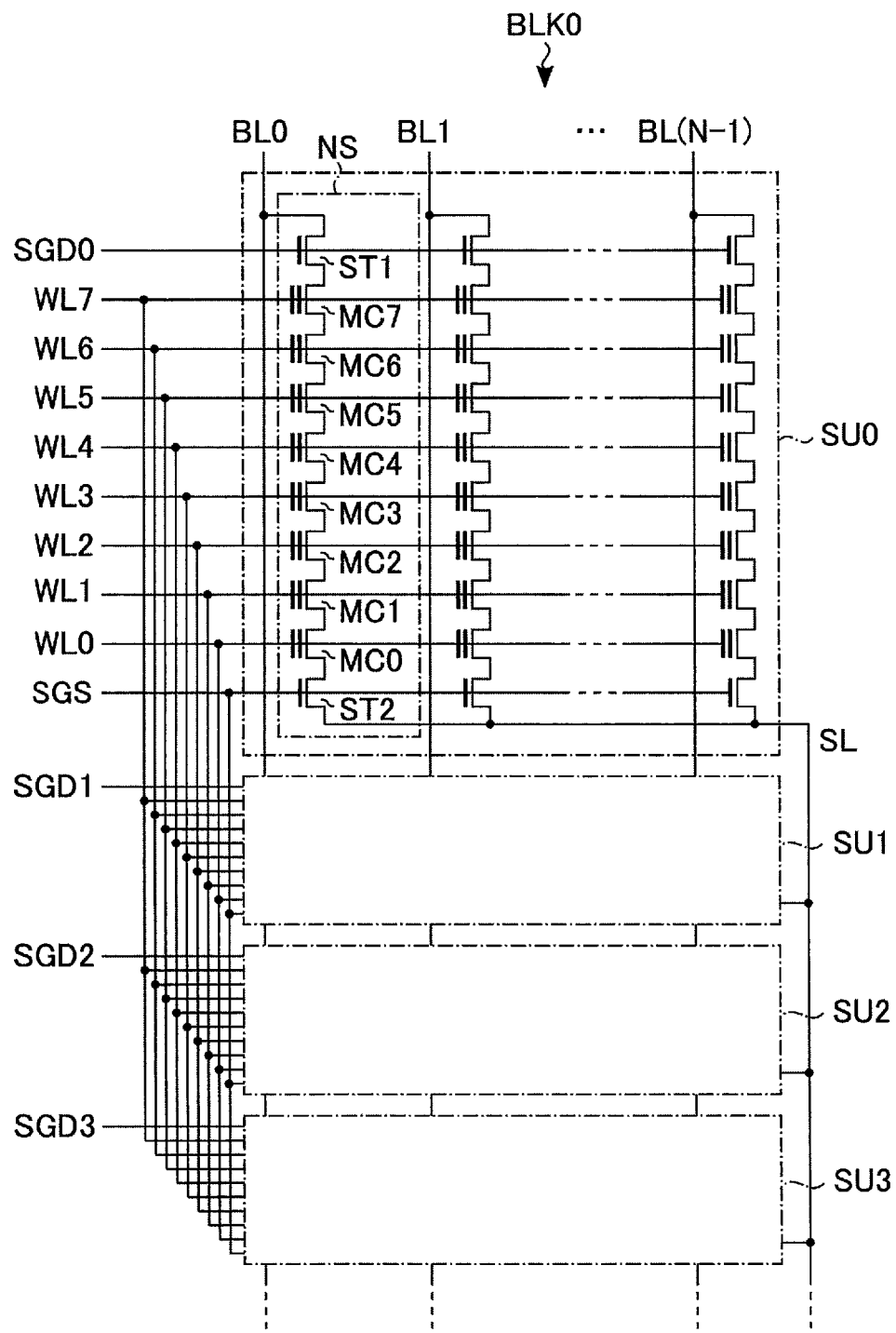
F I G. 2

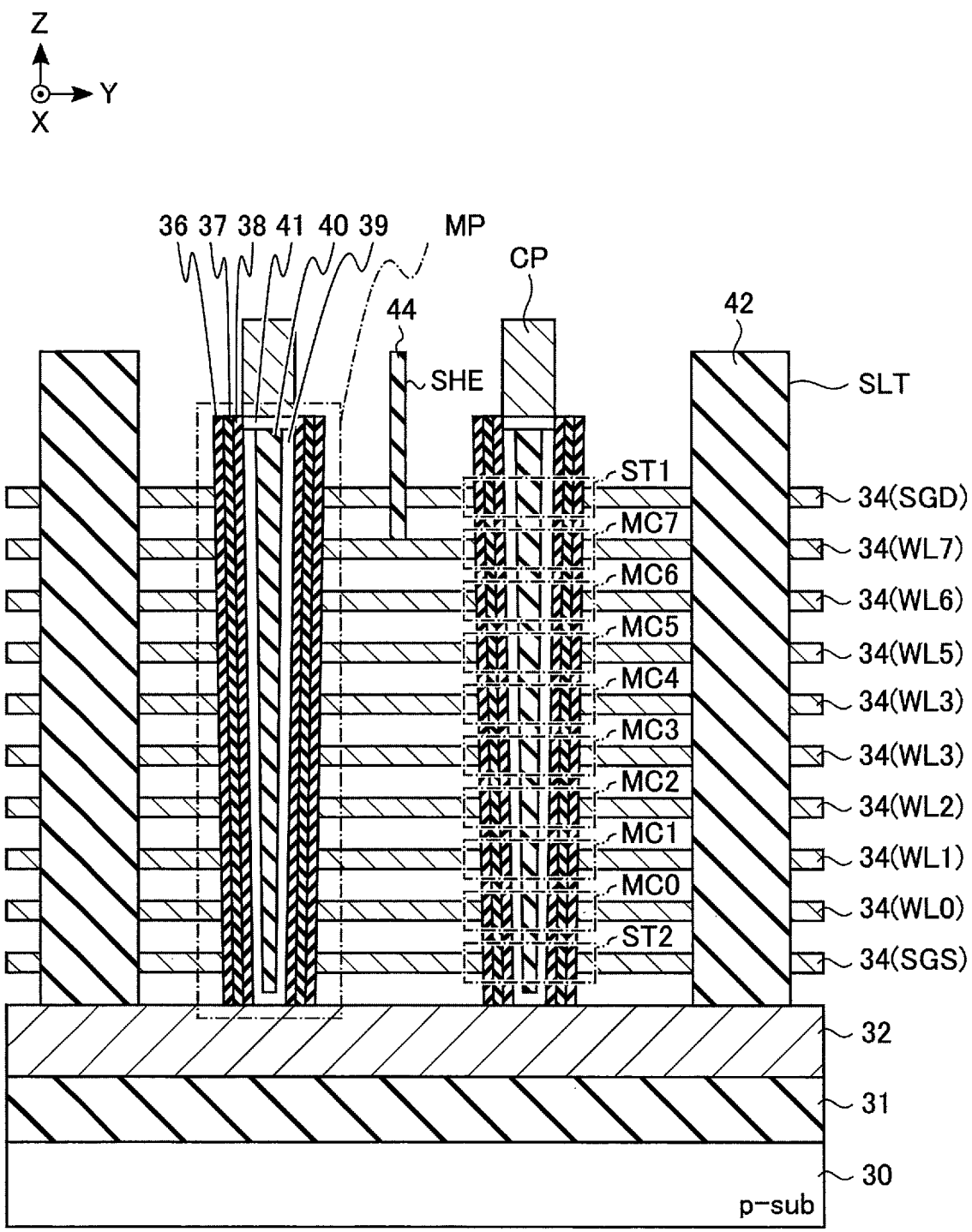
F I G. 3

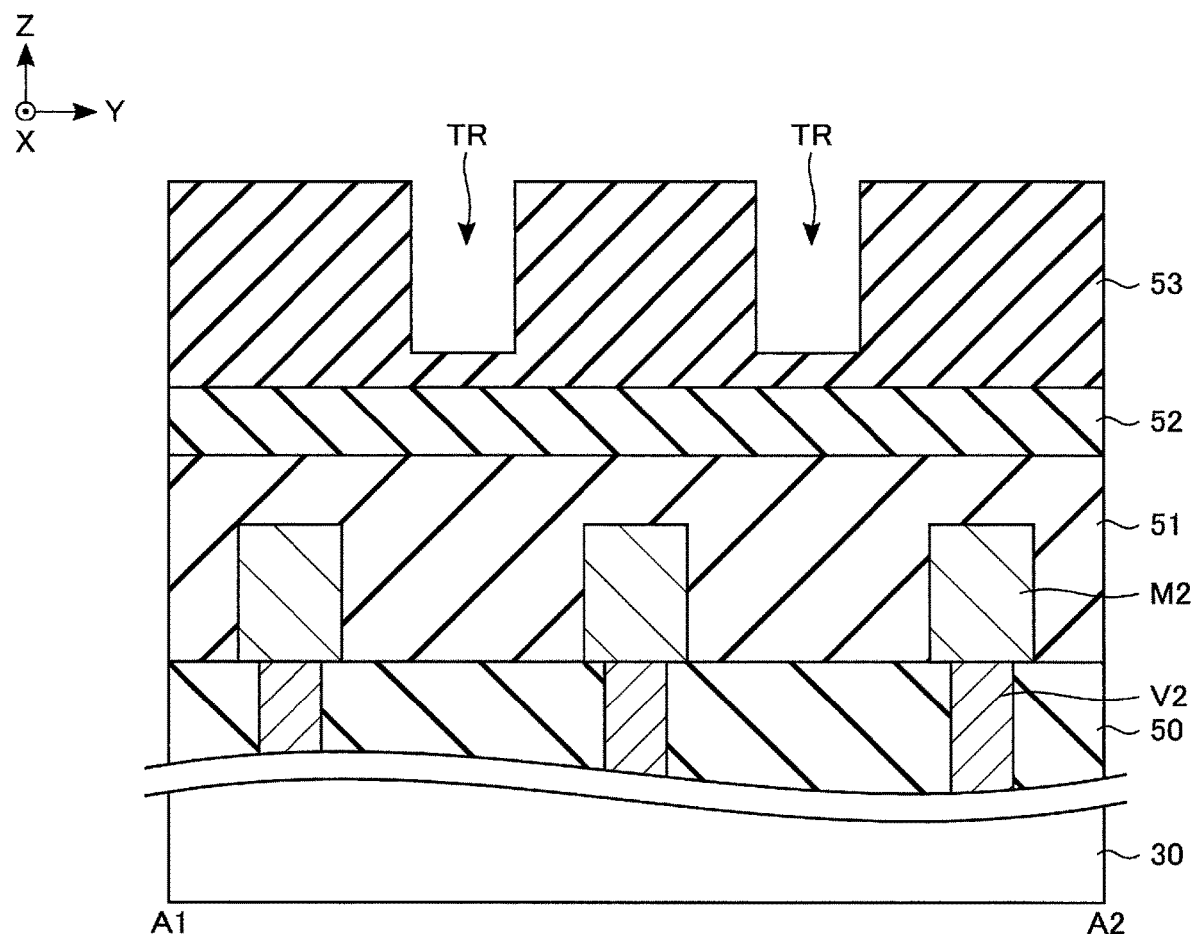
F I G. 5

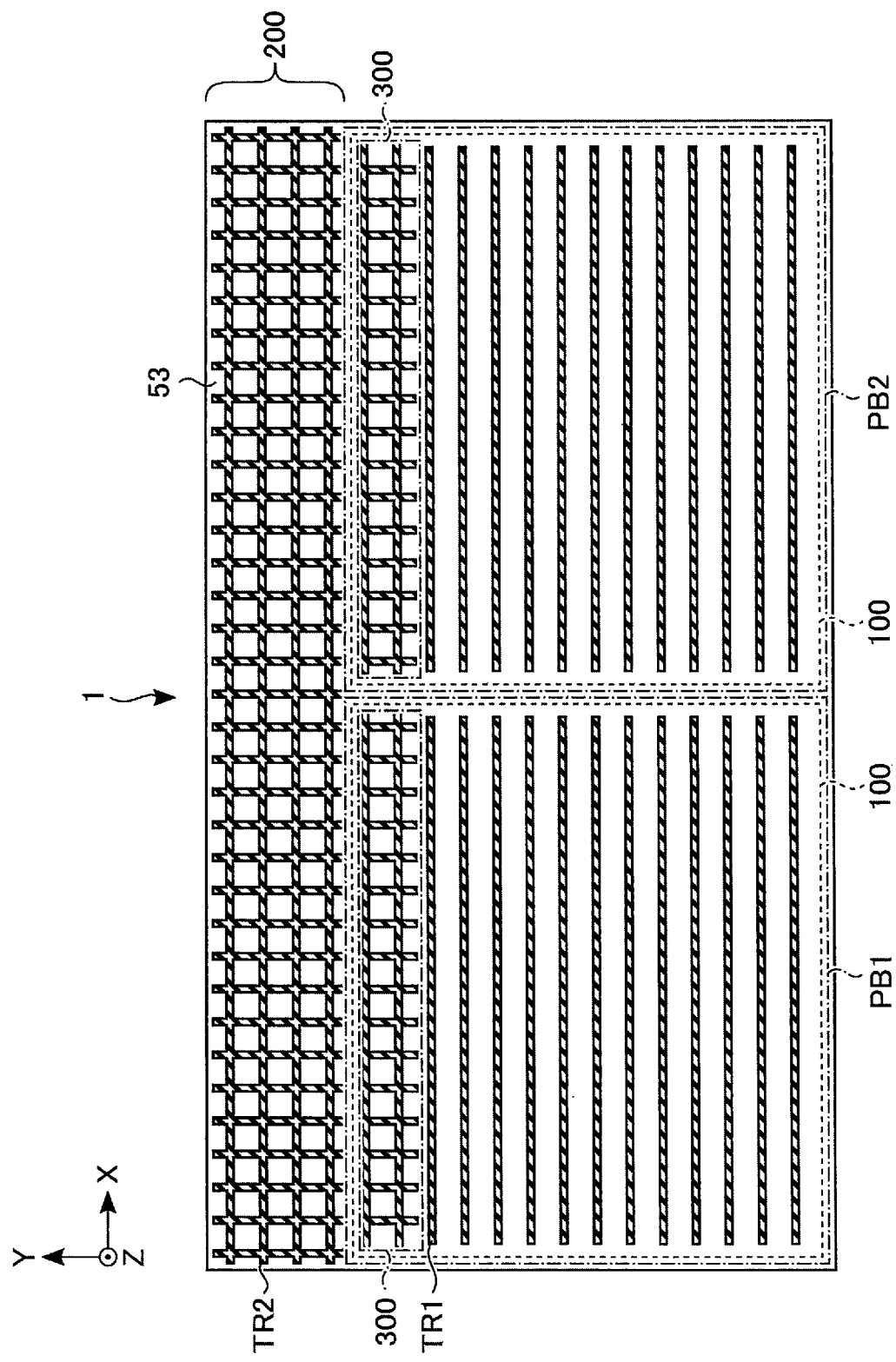
F I G. 8

SEMICONDUCTOR MEMORY DEVICE

CROSS-REFERENCE TO RELATED APPLICATIONS

This application is based upon and claims the benefit of priority from Japanese Patent Application No. 2019-147772, filed Aug. 9, 2019, the entire contents of which are incorporated herein by reference.

FIELD

Embodiments described herein relate generally to a semiconductor memory device.

BACKGROUND

As a semiconductor memory device, a NAND-type flash memory is known.

BRIEF DESCRIPTION OF THE DRAWINGS

FIG. 1 is a block diagram of a semiconductor memory device according to a first embodiment;

FIG. 2 is a circuit diagram of a memory cell array included in the semiconductor memory device according to the first embodiment;

FIG. 3 is a sectional view of the memory cell array included in the semiconductor memory device according to the first embodiment;

FIG. 5 is a sectional view of the semiconductor memory device according to the first embodiment;

FIG. 8 is a plan view of a semiconductor memory device according to a third example of the second embodiment.

DETAILED DESCRIPTION

Figure 4:
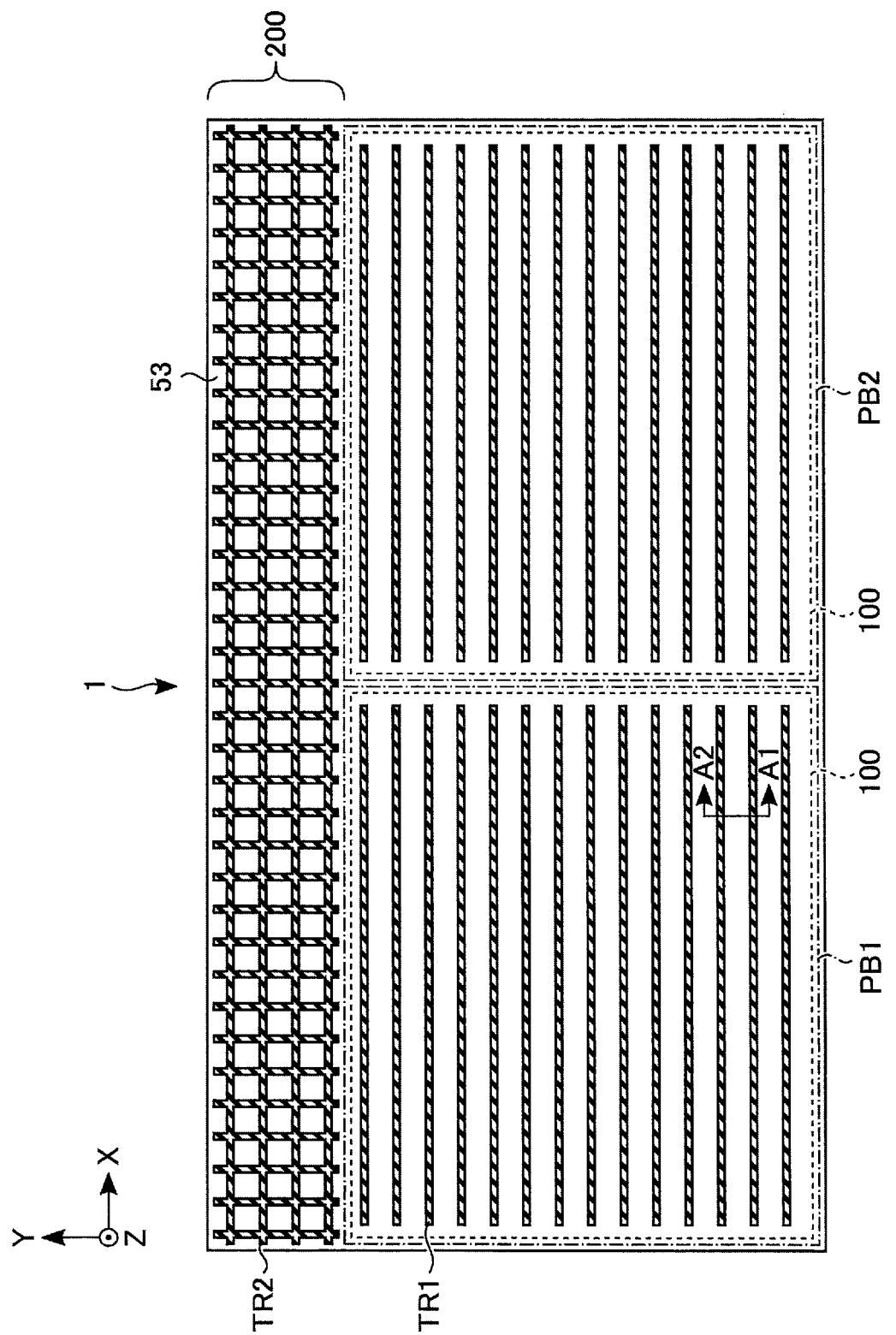
FIG. 4 is a plan view of the semiconductor memory device according to the first embodiment.

In general, according to one embodiment, a semiconductor memory device includes: a memory cell array including: a plurality of memory cells stacked above a substrate, and a plurality of word lines respectively coupled to gates of the plurality of memory cells and extending in a first direction; and a first film including a first area above the memory cell array and a second area different from the first area, and having a compressive stress higher than silicon oxide. In the first area, a plurality of first trenches extending in the first direction are aligned in a second direction that intersects the first direction. In the second area, a second trench in a mesh form is provided.

Hereinafter, embodiments will be described with reference to the accompanying drawings. In the following description, structural elements having approximately the same function and configuration will be assigned the same reference symbol, and a repeat description will be given only where necessary. Each of the embodiments described below merely indicates an exemplary apparatus or method for embodying the technical idea of the embodiment. The structural elements' materials, shapes, structures, arrangements, etc. of the technical ideas of the embodiments are not limited to the ones described below. A technical idea of the embodiment may be modified in various ways in the claims.

1. First Embodiment

A semiconductor memory device according to the first embodiment will be described. Hereinafter, a three-dimensionally stacked type NAND-type flash memory, in which memory cell transistors are three-dimensionally stacked above a semiconductor substrate, will be described as an example of the semiconductor memory device.

1.1 Configuration

1.1.1 Overall Configuration of Semiconductor Memory Device

First, with reference to FIG. 1, an overall configuration of the semiconductor memory device will be described. FIG. 1 is a block diagram showing an example of the basic overall configuration of the semiconductor memory device.

As shown in FIG. 1, the semiconductor memory device 1 includes a memory core unit 10 and a peripheral circuitry unit 20.

The memory core unit 10 includes a memory cell array 11, a row decoder 12, and a sense amplifier 13.

The memory cell array 11 includes a plurality of blocks BLK (BLK0, BLK1, BLK2, ... ). The blocks BLK each include a plurality of (four in this embodiment) string units SU (SU0 to SU3), each of which is a set of NAND strings NS each including memory cell transistors coupled in series. The number of blocks BLK in the memory cell array 11 and the number of string units SU in the block BLK may be any number.

The row decoder 12 decodes a row address received from an external controller (not shown). The row decoder 12 selects a row direction of the memory cell array 11 based on a result of the decoding. More specifically, the row decoder 12 applies voltages to various interconnects for selecting a line extending in the row direction.

The sense amplifier 13 senses data read from a block ELK when data is read. The sense amplifier 13, when data is written, applies voltages corresponding to write data to the memory cell array 11.

The periphery circuitry unit 20 includes a sequencer 21 and a voltage generator 22.

The sequencer 21 controls the operation of the entire semiconductor memory device 1. More specifically, the sequencer 21 controls, for example, the voltage generator 22, the row decoder 12, and the sense amplifier 13 in a write operation, a read operation, and an erase operation.

The voltage generator 22 generates voltages used for the write operation, the read operation, and the erase operation, and supplies the voltages to the row decoder 12, the sense amplifier 13, etc.

1.1.2 Circuitry Configuration of Memory Cell Array

Next, with reference to FIG. 2, the configuration of the memory cell array 11 will be described. FIG. 2 is a circuit diagram of the memory cell array 11. The example of FIG. 2 shows block BLK0, but other blocks BLK have the same structure.

As shown in FIG. 2, block BLK0 includes, for example, four string units SU0 to SU3. Each of the string units SU includes a plurality of NAND strings NS. Each NAND string NS includes, for example, eight memory cell transistors MC (MC0 to MC7), and selection transistors ST1 and ST2. Each memory cell transistor MC includes a control gate and a charge storage layer, and stores data in a nonvolatile manner. Hereinafter, memory cell transistors MC0 to MC7 will each be referred to as memory cell transistor MC unless specified.

The memory cell transistor MC may be of a MONOS type which uses an insulating film as the charge storage layer, or of an FG type which uses a conductive layer as the charge storage layer. In the present embodiment, a MONOS-type memory cell transistor will be described as an example. The number of memory cell transistors MC is not limited to 8, and may be, but is not limited to, 16, 32, 64, 96, 128, etc. In the example of FIG. 2, one selection transistor ST1 and one selection transistor ST2 are included in one NAND string NS, but any number equal to or greater than 1 of selection transistors ST1 and ST2 each may be included in one NAND string NS.

In NAND string NS, the current paths of selection transistor ST2, memory cell transistors MC0 to MC7, and selection transistor ST1 are coupled in series in this order. The selection transistor ST1 includes a drain coupled to a corresponding bit line BL. The selection transistor ST2 includes a source coupled to the source line SL.

The control gates of memory cell transistors MC0 to MC7 of each NAND string NS in the same block BLK are respectively coupled in common to different word lines WL0 to WL7. More specifically, control gates of a plurality of memory cell transistors MC0 in the block BLK are coupled in common to word line WL0.

In string units SU0 to SU3, a plurality of selection transistors ST1 are coupled in common to corresponding select gate lines SGD0 to SGD3. More specifically, in string unit SU0, gates of a plurality of selection transistors ST1 are coupled in common to select gate line SGD0. The same applies to SU1 to SU3. Hereinafter, select gate lines SGD0 to SGD3 will each be referred to as select gate line SGD unless specified.

The gates of selection transistors ST2 in the same block BLK are coupled in common to select gate line SGS. The gates of selection transistors ST2 respectively included in string units SU0 to SU3 may be coupled to different select gate lines SGS for each string unit SU.

The drains of selection transistors ST1 in a string unit SU are coupled to different bit lines BL (BL0 to BL (N-1), where N is a natural number equal to or greater than 2). That is, NAND strings NS in the string unit SU are respectively coupled to different bit lines BL. Each bit line BL is coupled in common to one NAND string NS in each string unit SU.

The sources of selection transistors ST2 in blocks BLK are coupled in common to a source line SL.

That is, a string unit SU is a set of NAND strings NS coupled to different bit lines BL and commonly coupled to the same select gate line SGD. A block ELK is a set of a plurality of string units SU sharing word lines WL. The memory cell array 11 is a set of a plurality of blocks BLK sharing bit lines BL.

The memory cell array 11 may have other configurations. That is, a configuration of the memory cell array 11 is described in, for example, U.S. patent application Ser. No. 12/407,403 filed on Mar. 19, 2009, entitled "THREE DIMENSIONAL STACKED NONVOLATILE SEMICONDUCTOR MEMORY". It is also described in U.S. patent application Ser. No. 12/406,524 filed on Mar. 18, 2009, entitled "THREE DIMENSIONAL STACKED NON-VOLATILE SEMICONDUCTOR MEMORY"; U.S. patent application Ser. No. 12/679,991 filed on Mar. 25, 2010, entitled "NON-VOLATILE SEMICONDUCTOR STORAGE DEVICE AND METHOD OF MANUFACTURING THE SAME"; and U.S. patent application Ser. No. 12/532,030 filed on Mar. 23, 2009, entitled "SEMICONDUCTOR MEMORY AND METHOD FOR MANUFACTURING SAME". The entire contents of these patent applications are incorporated herein by reference.

1.1.3 Cross-Sectional Configuration of Memory Cell Array

Next, with reference to FIG. 3, the configuration of the memory cell array 11 will be described. FIG. 3 is a cross-sectional view of the memory cell array 11. In the example shown in FIG. 3, a part of the insulating layer is omitted.

As shown in FIG. 3, an insulating layer 31 is formed on a semiconductor substrate 30. For the insulating layer 31, silicon oxide ($SiO_2$) may be used. A circuit such as a row decoder 12 or sense amplifier 13 may be provided in a region of the insulating layer 31 below the memory cell array 11, i.e., between the semiconductor substrate 30 and the interconnect layer 32. The interconnect layer 32, which functions as a source line SL, is formed on the insulating layer 31. The interconnect layer 32 is made of a conductive material, for example, an n-type semiconductor, a p-type semiconductor, or a metal material is used.

Above the interconnect layer 32, ten interconnect layers 34 are stacked with a space interposed therebetween in a Z direction that is substantially vertical to the semiconductor 30, and the ten interconnect layers 34 function as select gate line SGS, word lines WL0 to WL7, and select gate line SGD. The interconnect layers 34 extend in an X direction that is substantially parallel to the semiconductor 30 and substantially orthogonal (intersecting) to the Z direction. A slit SLT extending in the X direction divides the interconnect layers 34 in a Y direction that is substantially parallel to the semiconductor 30 and substantially orthogonal to the X direction, for example, for each block BLK. The slit SLT is filled with an insulating layer 42. For the insulating layer 42, $SiO_2$ may be used.

The interconnect layers 34 are made of a conductive material, for example, an n-type semiconductor, a p-type semiconductor, or a metal material such as tungsten (W) is used. In the present embodiment described below, a layered structure of titanium nitride (TiN) and W is used as the interconnect layers 34. TiN has a function as a barrier layer for preventing a reaction between W and Si or silicon oxide ($SiO_2$) or as an adhesive layer for improving adhesion of W when W is formed by, for example, chemical vapor deposition (CVD).

For example, W formed by the CVD produces a tensile stress. As a result, for example, when the interconnect layers 34 are rectangular and planar with their sides longer in the X direction and shorter in the Y direction, the semiconductor memory device 1 is affected by the residual stress of the stacked word lines WL and select gate lines SGS and SGD to become warped considerably in the X direction.

The uppermost interconnect layer 34 functioning as the select gate line SGD is, for example, further divided in the Y direction for each string unit SU, by slit SHE extending in the X direction between two slits SLT. The slit SHE is filled up with an insulating layer 44. For the insulating layer 44, $SiO_2$ may be used.

Between two slits SLT in the Y direction, a plurality of memory pillars MP that extend in the Z direction are arranged along the X direction. The memory pillars MP between two slits SLT may be arranged in any manner. The memory pillars MP may be staggered in four lines, eight lines, or sixteen lines, in the X direction. Each of the memory pillars MP corresponds to one NAND string NS.

The memory pillar MP includes a block insulating film 36, a charge storage layer 37, a tunnel insulating film 38, a semiconductor layer 39, a core layer 40, and a capping layer 41. More specifically, a hole corresponding to the memory pillar MP is formed so as to pass through the ten interconnect layers 34 to have its bottom reach the interconnect layer 32. In the inner surface of the hole, the block insulating film 36, the charge storage layer 37, and the tunnel insulating film 38 are stacked in this order from the outer periphery. A semiconductor layer 39 is formed in such a manner that its side surface is in contact with the tunnel insulating film 38 and its bottom surface is in contact with the interconnect layer 32. The semiconductor layer 39 is a region where the channels of the memory cell transistors MC and selection transistors ST1 and ST2 are formed. Therefore, the semiconductor layer 39 functions as a signal line that couples the current paths of selection transistor ST2, memory cell transistors MC0 to MC7, and selection transistor ST1. A core layer 40 is provided in the semiconductor layer 39. A capping layer 41 is formed on the semiconductor layer 39 and the core layer 40, with its side surface in contact with the tunnel insulating film 38.

For the block insulating film 36, the tunnel insulating film 38, and the core layer 40, $SiO_2$ may be used. For the charge storage layer 37, silicon nitride (SiN) may be used. For the semiconductor layer 39 and capping layer 41, polysilicon may be used.

Memory cell transistors MC0 to MC7 are formed by the memory pillar MP and eight interconnect layers 34 that respectively function as word lines WL0 to WL7. Similarly, selection transistors ST1 and ST2 are formed by the memory pillar MP and two interconnect layers 34 that respectively function as select gate lines SGD and SGS.

In the example of FIG. 3, one interconnect layer 34 functioning as the select gate line SGD and one interconnect layer 34 functioning as the select gate line SGS are provided, but a plurality of them may be provided.

A contact plug CP is provided on the capping layer 41. The contact plug CP is electrically coupled to an interconnect layer (not shown) functioning as a bit line BL. For example, a metallic material such as W or TiN is used for the contact plug CP.

1.1.4 Planar Configuration of Semiconductor Memory Device

Next, with reference to FIG. 4, an example of a planar configuration of the semiconductor memory device 1 will be described. FIG. 4 is a plan view of the semiconductor memory device 1. The example of FIG. 4 shows a plane of a high compressive stress film 53 provided on the surface of the semiconductor memory device 1. The high compressive stress film 53 possesses a compressive stress higher than $SiO_2$. For example, considering that $SiO_2$ deposited by the parallel plate plasma CVD possesses a compressive stress of approximately −100 to −200 MPa (the sign "−" representing a compressive stress), it is preferable that the high compressive stress film 53 possess a high compressive stress of at least −300 MPa (having an absolute value of 300 MPa or greater).

As shown in FIG. 4, the high compressive stress film 53 includes a cell area 100 above the memory cell array 11, and a peripheral area 200 different than the cell area 100. More specifically, below the cell area 100, for example, two planes PB (PB1 and PB2) constituting the memory core unit 10 are provided. Hereinafter, in the cell area 100, an area corresponding to the plane PB will be referred to as a sub area. More specifically, the cell area 100 includes a first sub area corresponding to the plane PB1 and a second sub are corresponding to the plane PB2. Each plane PB includes the memory cell array 11, and is a unit for performing the write operation and the read operation, etc. The planes PB are independently operable and also simultaneously operable. Planes PB1 and PB2 in the present embodiment have the same configuration. The number or arrangement of planes PB may be determined in a discretionary manner.

Below the peripheral area 200, more specifically, the memory cell array 11 is not provided, but the peripheral circuitry unit 20 is provided. However, below the peripheral area 200, an area of the memory core unit 10 not including the memory cell array 11 may be included.

In the high compressive stress film 53 on the surface of the semiconductor memory device 1 (hereinafter also referred to as "chip"), trenches TR (TR1 and TR2) having different shapes are provided in the cell area 100 and the peripheral area 200 to control the warpage of the semiconductor memory device 1 in the X direction and the warpage in the Y direction. For example, according to the present embodiment, in the cell area 100, one or more of line-shaped trenches TR1 extending in the X direction are provided. More specifically, in the cell area 100, line-shaped trenches TR1 extending in the X direction are provided at a substantially equal interval in the Y direction.

For example, when the word lines WL of the memory cell array 11 are rectangular with their sides longer in the X direction and shorter in the Y direction, the warpage of the chip is larger in the X direction and smaller in the Y direction because of a residual stress of the word lines WL having a tensile stress. In contrast, if the high compressive stress film 53 includes trenches TR1 extending in the X direction, the residual stress of the high compressive stress film 53 in the Y direction becomes smaller than that in the X direction. In this manner, the warpage of the chip in the X direction can be significantly decreased as compared to the warpage in the Y direction. This can reduce the difference between the warpage of the chip in the X direction and the warpage in the Y direction. Although depending on the magnitude of the difference between the residual stress in the X direction based on word lines WL with a tensile stress and the residual stress in the Y direction, it is more efficient to arrange a plurality of trenches TR1 in the Y direction to reduce the difference between the warpage of the chip in the X direction and the warpage in the Y direction. For the number of trenches TR1 extending in the X direction, the interval between trenches TR1 in the Y direction, the length of trenches TR1 in the X direction, and the width of trenches TR1 in the Y direction, they may be determined in a discretionary manner. The depth (height in the Z direction) of trench TR1 may be any depth as long as it does not pass through the high compressive stress film 53.

In the peripheral area 200 (an area where the memory cell array 11 is not provided below), trench TR2 is formed in a mesh shape in which trenches extending in the X direction intersect trenches extending in the Y direction. With mesh-shaped trench TR2, the residual stress of the high compressive stress film 53 in the peripheral area 200 becomes smaller than that in the cell area 100 in both the X and the Y directions. Therefore, a change in the warpage of the chip due to the high compressive stress film 53 in the peripheral area 200 is smaller than that in the cell area 100.

For trench TR2, the number of trenches extending in the X direction and the Y direction and the intervals and width of trenches may be determined in a discretionary manner. For example, in a manner similar to trenches TR1, the depth (height in the Z direction) of trench TR2 may be any depth as long as it does not pass through the high compressive stress film 53. Furthermore, the depth of trench TR2 may not be uniform in the pattern. For example, trench TR2 at the intersection of trenches may have a depth deeper than that of the portion extending in the X direction or the Y direction. Furthermore, a shape different than a mesh shape may be provided according to the layout of the semiconductor memory device 1 or the warpage of the chip. In addition, a mesh shape does not have to be a shape in which trenches extending in the X direction intersect trenches extending in the Y direction. For example, the mesh shape may be turned 45 degrees in the X-Y plane.

1.1.5 Cross-Sectional Configuration of High Compressive Stress Film

Next, with reference to FIG. 5, a cross-sectional configuration of the high compressive stress film 53 will be described. FIG. 5 is a cross-sectional view taken along line A1-A2 in FIG. 4. For simplification of explanation, the example of FIG. 5 shows a configuration of an upper part from contact plug V2 on the uppermost layer, omitting the memory cell array 11 described with reference to FIG. 3

As shown in FIG. 5, for example, contact plug V2 that passes through the insulating layer 50 is provided above the memory cell array 11 (not shown). An insulating layer 51 is provided on the insulating layer 50, and an uppermost interconnect layer M2 is provided on the contact plug V2.

For insulating layers 50 and 51, $SiO_2$ may be used. The contact plug V2 and the interconnect layer M2 are made of a conductive material. For the contact plug V2 and interconnect layer M2, a metallic material such as aluminum (Al) may be used.

An insulating layer 52 is provided on the insulating layer 51 to function as a passivation film. For the insulating layer 52, an insulating material with low moisture permeability is used. For the insulating layer 52, SiN formed by a parallel plate plasma CVD may be used.

The high compressive stress film 53 is provided on the insulating layer 52. In the high compressive stress film 53, trenches TR are formed. The trench TR does not pass through the high compressive stress film 53. That is, the bottom surface of the trench TR does not reach the insulating layer 52.

For the high compressive stress film 53, SiN formed by a parallel plate plasma CVD may be used. In addition, SiN may be used for the insulating layer 52 and the high compressive stress film 53. The passivation film (insulating layer 52) and the high compressive stress film 53 satisfy film properties different from each other. Therefore, for example, SiN used for the insulating layer 52 and SiN used for the high compressive stress film 53 have different conditions of film formation, and have different film properties such as a film stress or a hydrogen concentration in the film. For example, the in-film hydrogen concentration of SiN used for the insulating layer 52 is higher than that of SiN used for the high compressive stress film 53. The insulating layer 52 and the high compressive stress film 53 can be distinguished by, for example, cross-section observation or analysis of the hydrogen concentration in the film, etc. such as secondary ion mass spectrometry (SIMS).

A resin as a protective film may be provided on the high compressive stress film 53. For the resin, polyimide may be used. The high compressive stress film 53 is provided on the insulating layer 52, but the insulating layer 52 may be provided on the high compressive stress film 53.

1.2 Advantageous Effect of Present Embodiment

The configuration according to the present embodiment can provide a semiconductor memory device that can enhance yield. Such an effect is described in detail.

For example, if the memory cell array 11 has word lines WL that are rectangular with their sides longer in the X direction and shorter in the Y direction, the warpage of the chip in the X direction is larger than that in the Y direction due to the influence of word lines WL with a tensile stress. This tendency becomes more apparent as the number of layered word lines WL increases in accordance with the higher integration of a three-dimensionally layered NAND-type flash memory. As the difference between the warpage in the X direction and the warpage in the Y direction increases, for example, the chip is lifted up from a dicing tape and easily peeled off after the chip dicing process. Furthermore, the implementing process may involve problems such as bonding failure, coupling failure between chips when chips are stacked, or exposure of the chip from the package external form.

One of the methods of reducing the warpage of the chip caused by the tensile stress of word lines WL is to use the high compressive stress film 53. However, the warpage in the memory cell array 11 and the warpage in another circuit are different. For this reason, if the high compressive stress film 53 acts evenly on the entire chip to reduce the warpage of the memory cell array 11, for example, unnecessary warpage change may be caused in an area where another circuit is provided, which may result in a problem such as bonding failure, coupling failure between chips when chips are stacked, or exposure of the chip from the package external form. Thus, by the method of providing an effect of the high compressive stress film 53 evenly on the entire chip, it is difficult to deal with a complex warpage.

In contrast, with the configuration of the present embodiment, trenches TR1 and TR2 having different shapes can be provided in the high compressive stress film 53 according to the layout of the semiconductor memory device 1. More specifically, the high compressive stress film 53 includes the cell area 100 and the peripheral area 200. In addition, in the cell area 100, trenches TR1 extending in the X direction are formed in the high compressive stress film 53, while in the peripheral area 200, mesh-shaped trench TR2 is formed in the high compressive stress film 53. In this manner, it is possible, in the peripheral area 200, to suppress a change in the warpage of the chip due to the residual stress of the high compressive stress film 53, and to decrease, in the cell area 100, the difference between the warpage of the chip in the X direction and the warpage in the Y direction due to the residual stress of the high compressive stress film 53. By controlling the residual stress due to the high compressive stress film 53 for each area, it is possible to reduce the difference between the warpage of the chip in the X direction and the warpage in the Y direction, and to improve the producing yield.

2. Second Embodiment

Next, the second embodiment will be described. In the second embodiment, four examples will be described regarding layouts of trenches TR1 and TR2 that are different from those in the first embodiment. Hereinafter, the matters different from the first embodiment will be mainly described.

2.1 First Example

Figure 6:
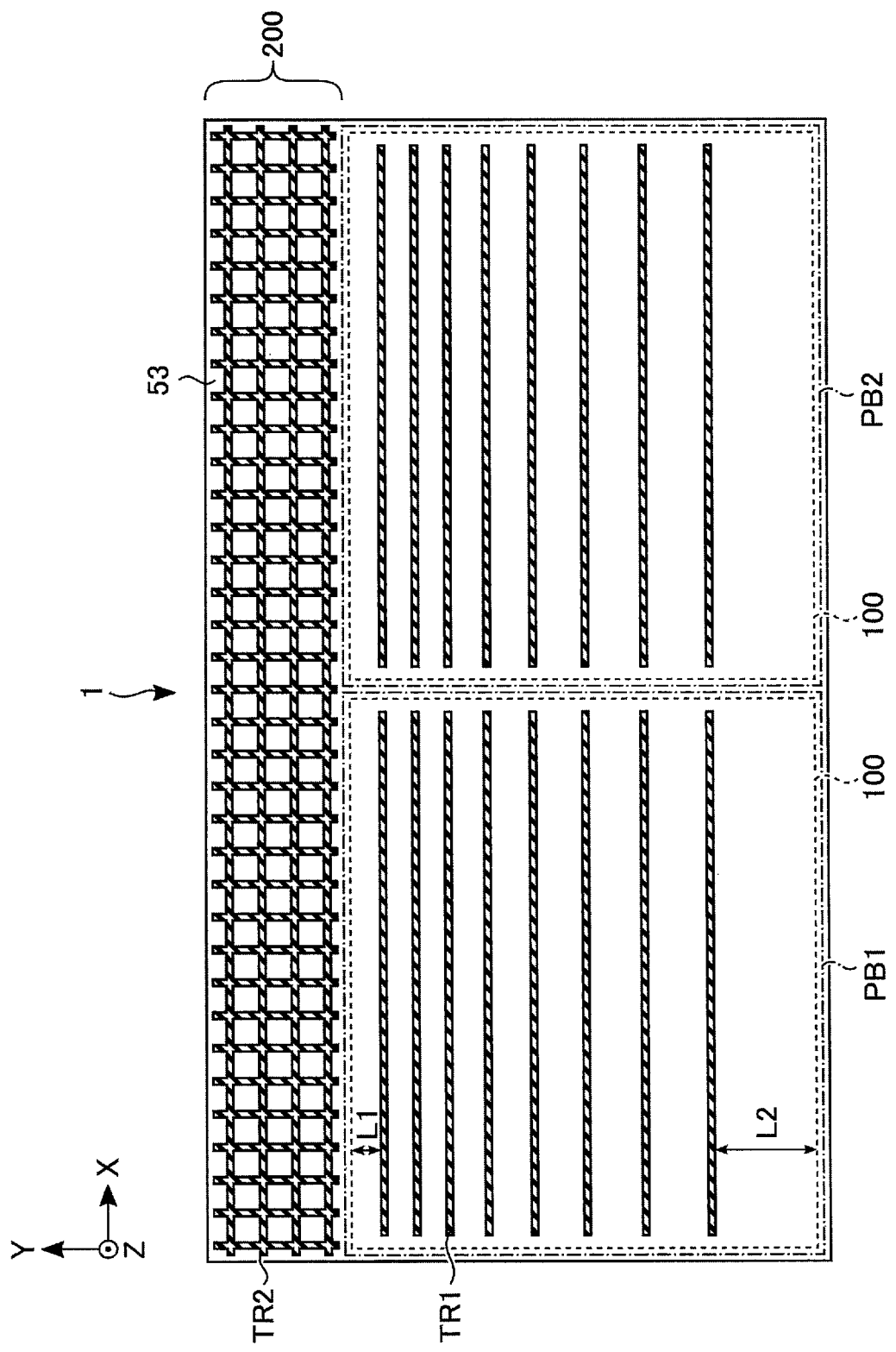
FIG. 6 is a plan view of a semiconductor memory device according to a first example of a second embodiment.

First, with reference to FIG. 6, a planar configuration of the semiconductor memory device 1 of the first example will be described. FIG. 6 is a plan view of the semiconductor memory device 1 of the first example.

As shown in FIG. 6, in the cell area 100, trenches TR1 are arranged at intervals that are different in the Y direction in which trenches TR1 each have the same length in the X direction and have a line shape. More specifically, trenches TR1 are arranged in such a manner that the interval between trenches TR1 gradually increases from the end of the cell area 100 facing the peripheral area 200 (upper side of the drawing sheet) to the end of the cell area 100 that is opposite to the end of the cell area 100 facing the peripheral area 200 and that faces the edge of the chip (lower side of the drawing sheet). In other words, trenches TR1 are arranged in such a manner that the interval between trenches TR1 gradually decreases toward the peripheral area 200.

In the cell area 100, it is assumed that the width of the high compressive stress film 53 outside trench TR1 closest to the end of the cell area 100 facing the peripheral area 200 is L1, while the width of the high compressive stress film 53 outside trench TR1 farthest from the end of the cell area 100 facing the peripheral area 200 (closest to the end of the cell area 100 facing the edge of the chip) is L2. Distances L1 and L2 have the relationship of L1<L2.

For example, the memory cell array 11 produces a residual stress different than that of the peripheral circuitry unit 20. Thus, the residual stress of the memory cell array 11 may be offset in the vicinity of the peripheral circuitry unit 20 and may be reduced. Therefore, the difference between the warpage of the chip in the X direction and the warpage in the Y direction is larger at the end of cell area 100 facing the edge of the chip. If the interval of trenches TR1 in the Y direction is increased, the amount of the high compressive stress film 53 to be removed by trenches TR1 is reduced, resulting in an increase in the influence of the high compressive stress film 53 on the warpage of the chip. Therefore, the interval of trenches TR1 in the Y direction is set wider at least in the vicinity of the end of the cell area 100 facing the edge of the chip. Alternatively, the interval of trenches TR1 in the Y direction is set narrower at least in the vicinity of the end of the cell area 100 facing the peripheral area 200.

2.2 Second Example

Figure 7:
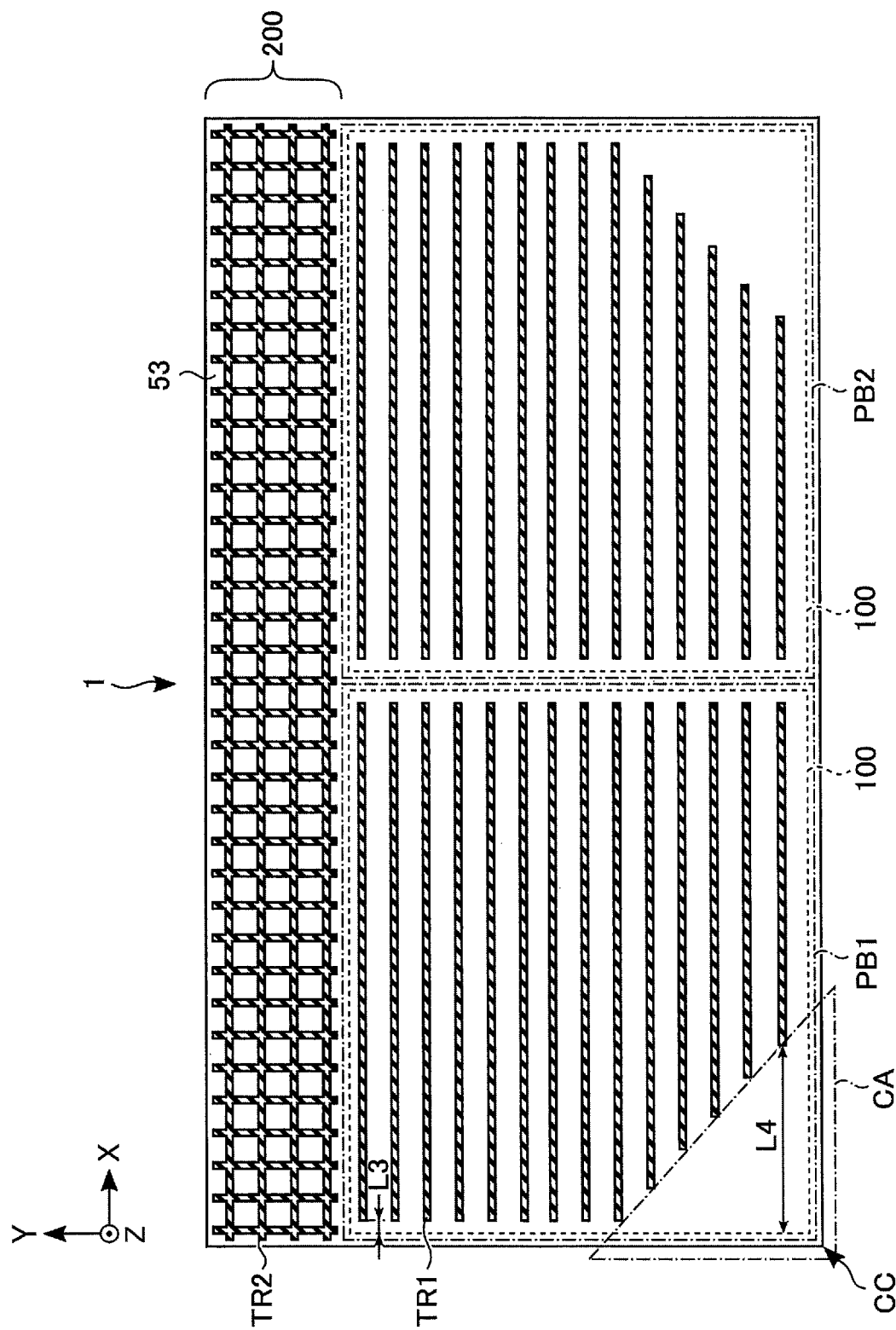
FIG. 7 is a plan view of a semiconductor memory device according to a second example of the second embodiment.

Next, with reference to FIG. 7, a planar configuration of the semiconductor memory device 1 of the second example will be described. FIG. 7 is a plan view of the semiconductor memory device 1 of the second example.

As shown in FIG. 7, in the cell area 100, trenches TR1 having different lengths in the X direction are arranged at a substantially equal interval in the Y direction such that the distance from a corner CC of the chip to the trenches TR1 on the X-Y plane is longer. More specifically, in plane PB1 (the first sub area), trenches TR1 having different lengths in the X direction are arranged such that the distance from the corner CC of the chip on the lower left side of the drawing sheet to trenches TR1 is longer. In plane PB2 (the second sub area), trenches TR1 having different lengths in the X direction are arranged such that the distance from the corner CC of the chip on the lower right side of the drawing sheet to trenches TR1 is longer. For example, in trench TR1 closest to the end of the cell area 100 facing the peripheral area 200, it is assumed that a distance from the end in the X direction of the cell area 100 facing the edge of the chip to the end of trench TR1 is L3. In trench TR1 farthest from the end of the cell area 100 facing the peripheral area 200, it is assumed that a distance from the end in the X direction of the cell area 100 facing the edge of the chip to the end of trench TR1 is L4. Distances L3 and L4 satisfy the relationship of L3<L4.

The warpage of the chip tends to be greater at the corner CC of the chip facing the memory cell array 11. Thus, trenches TR1 are not provided at the area CA in the vicinity of the corner CC of the chip so as to increase the influence of the high compressive stress film 53 on the warpage of the corner CC of the chip.

2.3 Third Example

Next, with reference to FIG. 8, a planar configuration of the semiconductor memory device 1 of the third example will be described. FIG. 8 is a plan view of the semiconductor memory device 1 of the third example.

As shown in FIG. 8, the residual stress of the memory cell array 11 tends to be comparatively smaller in the vicinity of the peripheral circuitry unit 20. Therefore, the mesh-shaped trench TR2 is provided at an end region 300 in the cell area 100 facing the peripheral area 200. In mesh-shaped trench TR2 provided in the peripheral circuitry unit 20 and mesh-shaped trench TR2 provided at the end region 300 in the cell area 100, trenches extending in the Y direction may be formed continuously over the peripheral circuitry unit 20 and the end region 300 in the cell area 100.

2.4 Fourth Example

Figure 9:
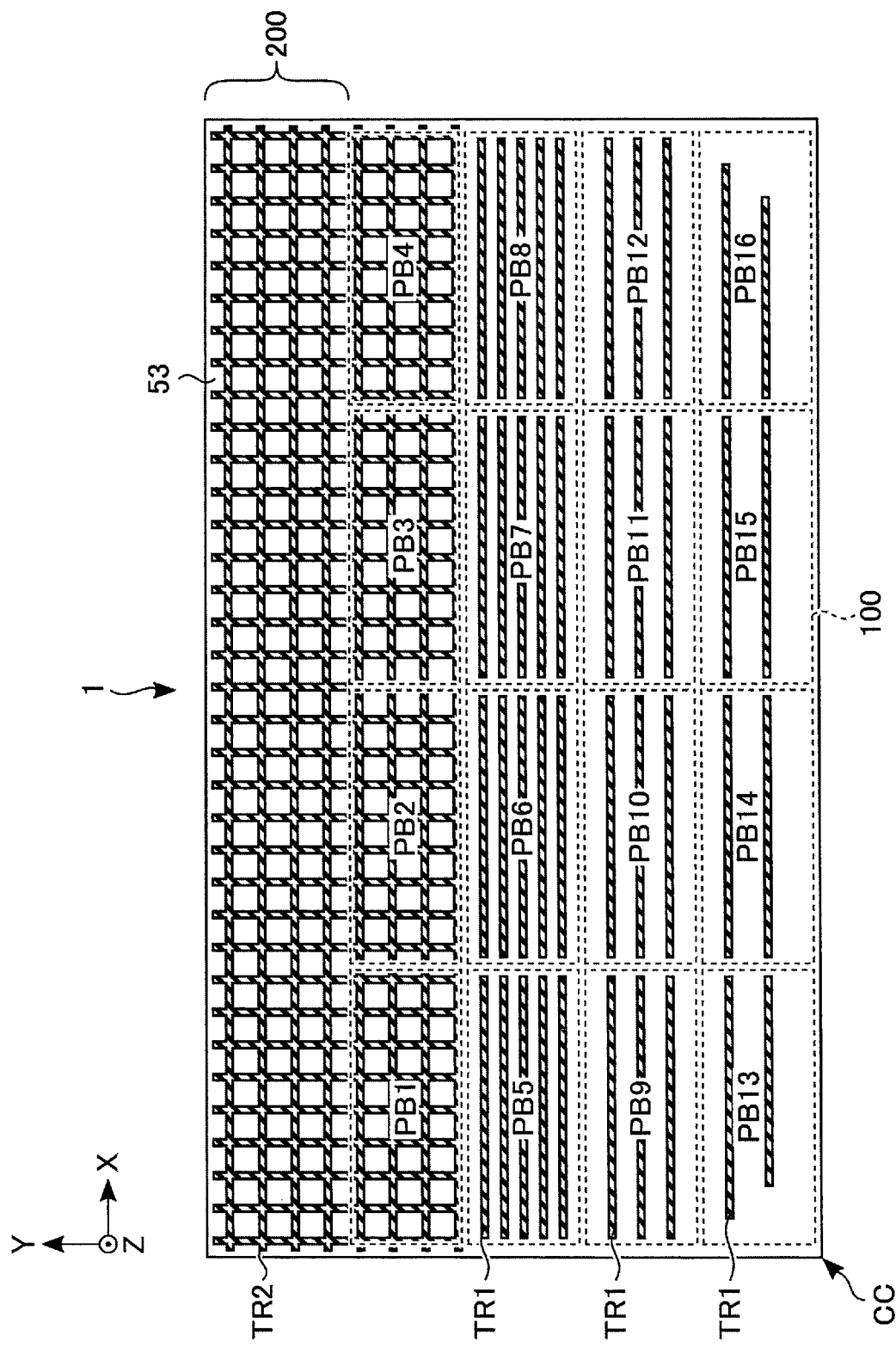
FIG. 9 is a plan view of a semiconductor memory device according to a fourth example of the second embodiment.

Next, with reference to FIG. 9, a planar configuration of the semiconductor memory device 1 of the fourth example will be described. FIG. 9 is a plan view of the semiconductor memory device 1 of the fourth example.

As shown in FIG. 9, in this example, the memory core unit 10 includes sixteen planes PB (PB1 to PB16) That is, the cell area 100 includes sixteen sub areas corresponding to the sixteen planes PB. For example, planes PB1 to PB16 have the same configuration. For example, planes PB1 to PB16 are arranged in a matrix of 4 rows×4 columns. In the example of FIG. 9, from the end of the memory core unit 10 facing the peripheral circuitry unit 20 toward the end of the memory core unit 10 facing the edge of the chip, planes PB1 to PB4 are arranged in the same row in this order, planes PB5 to PB8 are arranged in the same row in this order, planes PB9 to PB12 are arranged in the same row in this order, and planes PB13 to PB16 are arranged in the same row in this order.

The arrangement of trenches TR1 and TR2 in the cell area 100 above each plane PB varies depending on the layout. More specifically, in the cell area 100 above planes PB1 to PB4 facing the peripheral area 200, mesh-shaped trench TR2 is arranged. In the cell area 100 above planes PB5 to PB5, a plurality of trenches TR1 of the same length in the X direction are arranged at a substantially equal interval in the Y direction as in the first embodiment. In the cell area 100 above planes PB9 to PB12, trenches TR1 of the same length in the X direction are arranged at a substantially equal interval slightly wider in the Y direction than that in the cell area 100 above planes PB5 to PB8. In the cell area 100 above planes PB14 and PB15, trenches TR1 of the same length in the X direction are arranged at intervals that are different in the Y direction as in the first example. In the cell area 100 above planes PB13 and PB16, in combination with the first and second examples, trenches TR1 having different lengths in the X direction are arranged at intervals that are different in the Y direction such that the distance from the corner CC of the chip to trench TR1 increases.

Trenches TR1 formed in the same row may be formed continuously in the X direction throughout the cell area 100, and mesh-shaped trench TR2 provided in the cell area 100 above planes PB1 to PB4 may be formed in such a manner that trenches extending in the X direction are formed continuously in the X direction throughout the cell area 100.

2.5 Advantageous Effect of Present Embodiment

The configuration of the present embodiment can attain the same effect as the first embodiment.

The first embodiment and the first to fourth examples of the second embodiment may be combined whenever possible.

3. Modifications, Etc

According to the above embodiment, a semiconductor memory device including: a memory cell array (11) including a plurality of memory cells (MC) stacked above a substrate (30), and a plurality of word lines (WL) respectively coupled to gates of the plurality of memory cells and extending in a first direction (X direction); and a first film (53) including a first area (100) above the memory cell array and a second area (200) different from the first area, and having a compressive stress higher than silicon oxide. In the first area, a plurality of first trenches (TR1) extending in the first direction are aligned in a second direction (Y direction) that intersects the first direction. In the second area, a second trench (TR2) in a mesh form is provided.

By applying the above embodiments, it is possible to provide a semiconductor memory device that can enhance yield.

The embodiments are not limited to the above-described aspects, but can be modified in various ways.

According to the embodiments described above, for example, in the first area (the cell area 100) of the high compressive stress film 53, the line-shaped first trenches (TR1) extending in the first direction (X-direction) are provided. In contrast, because the difference between the stress in the X direction and the stress in the Y direction remaining after formation of the high compressive stress film 53 by covering the cell area 100 depends on the shape of the cell area 100 in the X-Y plane, formation of the first trenches (TR1) extending in the first direction may be omitted in the first area depending on the dimensional ratio between the X-direction length and the Y-direction length of the cell area 100.

For example, in a low-capacity product in which the memory capacity is relatively small and the Y-direction length of the cell area 100 is short, the Y-direction dimension in the first area of the high compressive stress film 53 is small; therefore, the residual stress of the high compressive stress film 53 in the Y direction in the first area is small without forming the first trenches (TR1) extending in the first direction. Accordingly, by only providing the mesh-shaped second trench (TR2) in the second area (the peripheral area 200), the difference between the warpage of the chip in the X direction and the warpage in the Y direction may be sufficiently reduced.

In addition, in the above-described embodiments, the first trenches (TR1) and the second trench (TR2) are provided to have a depth not penetrating the high compressive stress film 53; however, for example, with an etching stopper layer of $SiO_2$ or the like between the insulating layer 52 and the high compressive stress film 53, the first trenches (TR1) and the second trench (TR2) may be formed to have a depth penetrating the high compressive stress film 53.

The term "couple" in the above-described embodiments includes indirect coupling via a transistor, a resistor or the like.

The term "equal interval" in the above-described embodiments includes an error caused by a manufacturing variation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a plurality of memory cells stacked above a substrate, and a plurality of word lines respectively coupled to gates of the plurality of memory cells and extending in a first direction; and
   a first film including a first area above the memory cell array and a second area different from the first area, and having a compressive stress higher than silicon oxide, wherein
   in the first area, a plurality of first trenches extending in the first direction are aligned in a second direction that intersects the first direction, and
   in the second area, a second trench in a mesh form is provided.

2. The device according to claim 1, wherein the first film is provided on a passivation film.

3. The device according to claim 1, wherein at least a part of the plurality of first trenches are arranged at a substantially equal interval in the second direction.

4. The device according to claim 1, wherein at least a part of the plurality of first trenches are arranged at intervals decreasing toward the second area in the second direction.

5. The device according to claim 1, wherein at least a part of the plurality of first trenches are arranged to have lengths in the first direction decreasing from a second area side toward an edge of a chip in the second direction.

6. The device according to claim 1, wherein the second trench is provided at an end region of the first area facing the second area in the first area.

7. The device according to claim 1, wherein the plurality of first trenches are provided in the first film to have a depth not penetrating the first film.

8. The device according to claim 4, wherein a distance in the second direction between a first end of the first area facing the second area and the plurality of first trenches is shorter than a distance in the second direction between a second end of the first area facing an edge of a chip and the plurality of first trenches.

9. The device according to claim 5, wherein at least a part of the plurality of first trenches are arranged such that a distance between the first trenches and the edge of the chip in the first direction increases from the second area side toward the edge of the chip in the second direction.

10. The device according to claim 1, wherein the second trench includes a plurality of third trenches extending in the first direction and aligned in the second direction, and a plurality of fourth trenches crossing the plurality of third trenches, extending in the second direction, and aligned in the first direction.

11. The device according to claim 1, wherein the first area includes a first sub area and a second sub area aligned in the second direction from the second area toward an edge of a chip,
in the first sub area, the second trench is provided, and
in the second sub area, the plurality of first trenches are provided.

12. The device according to claim 1, wherein
the first area includes a third sub area and a fourth sub area aligned in the second direction from a second area side toward an edge of a chip,
in the third sub area, the plurality of first trenches are provided at a substantially equal interval including a first interval in the second direction, and
in the fourth sub area, the plurality of first trenches are provided at a substantially equal interval including a second interval wider than the first interval in the second direction.

13. The device according to claim 12, wherein the plurality of first trenches provided in the fourth sub area have a length in the first direction shorter than that of the plurality of first trenches provided in the third sub area.

14. The device according to claim 1, wherein the first film is SiN.

15. The device according to claim 1, wherein the plurality of word lines produce a tensile stress.

16. The device according to claim 1, further comprising an interconnect layer between the memory cell array and the first film.

17. The device according to claim 2, wherein the passivation film is SiN.

18. The device according to claim 17, wherein the first film is SiN having an in-film hydrogen concentration lower than that of the passivation film.

19. A semiconductor memory device comprising:
a memory cell array including a plurality of memory cells stacked above a substrate, and a plurality of word lines respectively coupled to gates of the plurality of memory cells and extending in a first direction; and
a first film including a first area above the memory cell array and a second area different from the first area, the first film having a compressive stress higher than silicon oxide and including a mesh-shaped trench in the second area.

20. The device according to claim 19, wherein the first film includes at least one trench extending in the first direction in the first area.

* * * * *